(12) United States Patent
Wu

(10) Patent No.: US 12,426,282 B2
(45) Date of Patent: *Sep. 23, 2025

(54) METHOD OF FORMING CAPACITOR HOLE, AND SEMICONDUCTOR STRUCTURE

(71) Applicant: CHANGXIN MEMORY TECHNOLOGIES, INC., Hefei (CN)

(72) Inventor: Yulei Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 478 days.

This patent is subject to a terminal disclaimer.

(21) Appl. No.: 17/935,630

(22) Filed: Sep. 27, 2022

(65) Prior Publication Data

US 2023/0019605 A1 Jan. 19, 2023

Related U.S. Application Data

(63) Continuation of application No. PCT/CN2021/127617, filed on Oct. 29, 2021.

(30) Foreign Application Priority Data

Jul. 5, 2021 (CN) .......................... 202110758236.1

(51) Int. Cl.
*H10D 1/00* (2025.01)
*H01L 21/033* (2006.01)
(Continued)

(52) U.S. Cl.
CPC ......... *H10D 1/043* (2025.01); *H01L 21/0337* (2013.01); *H01L 21/31116* (2013.01);
(Continued)

(58) Field of Classification Search
CPC ....... G03F 7/09; G03F 7/091; H01L 21/0276; H01L 21/31144; H01L 21/0332;
(Continued)

(56) References Cited

U.S. PATENT DOCUMENTS 10,816,894 B2   10/2020   Li
11,245,001 B2   2/2022    Kim et al.
(Continued)

FOREIGN PATENT DOCUMENTS

CN         1619415 A   *   5/2005    ........... G03F 7/0754
CN       105226046 A        1/2016
(Continued)

OTHER PUBLICATIONS

JP2020155764A—Machine English Translation (Year: 2025).*
(Continued)

*Primary Examiner* — Jose R Diaz
(74) *Attorney, Agent, or Firm* — Kilpatrick Townsend & Stockton LLP

(57) ABSTRACT

The present disclosure provides a method of forming a capacitor hole, and a semiconductor structure. The method includes: providing a substrate, where an electrode is formed in the substrate; forming a pattern definition layer on a surface of the substrate; sequentially forming three sets of trenches in the pattern definition layer, where the three sets of trenches intersect with each other at 120°, and a hexagonal hole is formed at an intersection position in the pattern definition layer; etching the substrate along the hexagonal hole by the pattern definition layer as a mask, to form a capacitor hole in the substrate, where a bottom of the capacitor hole is round under a loading effect of etching, and the electrode is exposed at the bottom of the capacitor hole.

14 Claims, 14 Drawing Sheets

(51) Int. Cl.
*H01L 21/311* (2006.01)
*H10D 1/68* (2025.01)

(52) U.S. Cl.
CPC ....... *H01L 21/31144* (2013.01); *H10D 1/696* (2025.01); *H10D 1/716* (2025.01)

(58) Field of Classification Search
CPC ............. H01L 21/3086; H01L 21/0274; H01L 21/0338; H01L 21/0337; H01L 21/31116; H10D 1/043; H10D 1/716
See application file for complete search history.

(56) References Cited

U.S. PATENT DOCUMENTS 11,784,060 B2 * 10/2023 Wu .................. H01L 21/32139
438/671

2008/0237794 A1 10/2008 Shoji
2020/0083224 A1 3/2020 Chang et al.

FOREIGN PATENT DOCUMENTS

| | | | |
|---|---|---|---|
| CN | 108054085 A | 5/2018 | |
| CN | 109116674 A | 1/2019 | |
| CN | 111199875 A | 5/2020 | |
| CN | 111381434 A | 7/2020 | |
| CN | 111725139 A | 9/2020 | |
| JP | 2020155764 A * | 9/2020 | ......... H01L 21/0217 |

OTHER PUBLICATIONS

CN1619415A—Machine English Translation (Year: 2025).*
International Search Report cited in PCT/CN2021/127617 mailed Mar. 28, 2022, 8 pages.

* cited by examiner

METHOD OF FORMING CAPACITOR HOLE, AND SEMICONDUCTOR STRUCTURE

CROSS-REFERENCE TO RELATED APPLICATIONS

The present disclosure is a continuation application of International Patent Application No. PCT/CN2021/127617, filed on Oct. 29, 2021, which claims the priority to Chinese Patent Application 202110758236.1, titled "METHOD OF FORMING CAPACITOR HOLE, AND SEMICONDUCTOR STRUCTURE" and filed with the China National Intellectual Property Administration (CNIPA) on Jul. 5, 2021. The entire contents of International Patent Application No. PCT/CN2021/127617 and Chinese Patent Application 202110758236.1 are incorporated herein by reference.

TECHNICAL FIELD

The present disclosure relates to, but is not limited to, a method of forming a capacitor hole, and a semiconductor structure.

BACKGROUND

In the existing capacitor fabrication scheme for a semiconductor structure, due to the exposure limit, the current immersion lithography process usually uses two layers of photomasks to form linear patterns in two directions. The linear patterns in both directions form a blank parallelogram pattern. After dry etching, the pattern is transferred downward and eventually forms a capacitive array in a roughly hexagonal arrangement.

However, taking a single capacitor as an example, the shape of the capacitor hole starts to change from the original parallelogram to an ellipse and is transferred downward. Due to the loading effect of etching, the top of the capacitor hole is constantly subjected to the effect of plasma, resulting in a more regular round shape, while the bottom of the capacitor hole is affected by the bombardment of etching gas, causing the bottom of the capacitor hole to maintain its original oval shape. The degree of ellipticity of the capacitor hole increases from the top to the bottom. On the one hand, the adhesion between a high-k material and the bottom electrode is limited, and coefficients of thermal expansion are different. Therefore, the stress is higher at the two ends of the capacitor hole with relatively large curvature of the ellipse, and voids are easily generated during the thermal process. On the other hand, due to the uneven curvature distribution of the capacitor hole, the electric field in the capacitor hole is unevenly distributed, and the density of the electric field is higher in the area with larger curvature, resulting in the defect of leakage.

SUMMARY

According to an aspect of the present disclosure, a method of forming a capacitor hole is provided, including: providing a substrate, where an electrode is formed in the substrate; forming a pattern definition layer on a surface of the substrate; sequentially forming three sets of trenches in the pattern definition layer, where the three sets of trenches intersect with each other at 120°, and a hexagonal hole is formed at an intersection position in the pattern definition layer; etching the substrate along the hexagonal hole by the pattern definition layer as a mask, to form a capacitor hole in the substrate, where a bottom of the capacitor hole is round under a loading effect of etching, and the electrode is exposed at the bottom of the capacitor hole.

According to another aspect of the present disclosure, a semiconductor structure with a capacitor hole is provided, where the capacitor hole is formed by the method of forming a capacitor hole described in the foregoing implementation and provided by the present disclosure.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure.

In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

Figure 1:
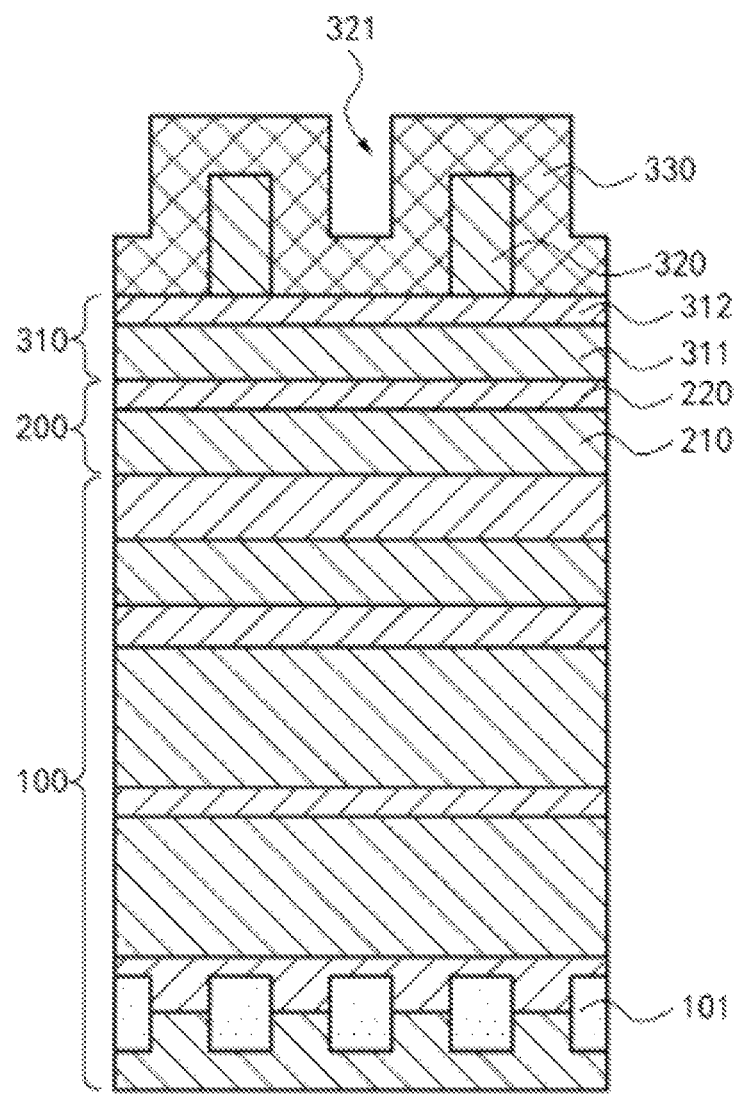

One or more embodiments are exemplified by corresponding accompanying drawings, and these exemplified descriptions do not constitute a limitation on the embodiments. Components with the same reference numerals in the accompanying drawings are denoted as similar components, and the accompanying drawings are not limited by scale unless otherwise specified.

The preferred implementations of the present disclosure will be described below in detail with reference to the accompanying drawings to make the objectives, features and advantages of the present disclosure more obvious. The accompanying drawings are merely exemplary illustrations of the present disclosure, and are not necessarily drawn to scale. The same reference numerals in the accompanying drawings always represent the same parts. In the drawings:

FIG. 1 to FIG. 3, FIG. 5 to FIG. 8, FIG. 10 to FIG. 13, and FIG. 15 to FIG. 17 are respectively schematic structural diagrams of semiconductor structures in steps of a method of forming a capacitor hole according to the present disclosure; and FIG. 4, FIG. 9, FIG. 14, FIG. 16, and FIG. 18 are respectively plan views of semiconductor structures in steps of a method of forming a capacitor hole according to the present disclosure.

DETAILED DESCRIPTION

The typical embodiments embodying the features and advantages of the present disclosure are described in detail below. It should be understood that the present disclosure may have various changes in different embodiments, which do not depart from the scope of the present disclosure. The description and accompanying drawings herein are essentially used for the purpose of explanation, rather than limiting the present disclosure.

Different exemplary implementations of the present disclosure are described below with reference to the accompanying drawings. The accompanying drawings form a part of the present disclosure, which show by way of example different exemplary structures, systems, and steps that can implement various aspects of the present disclosure. It should be understood that other specific solutions of components, structures, exemplary apparatuses, systems, and steps may be used, and structural and functional modifications may be made without departing from the scope of the present disclosure. Moreover, although the terms such as "above", "between", and "within" may be used in this specification to describe different exemplary features and elements of the present disclosure, these terms are used herein only for convenience of description, for example, according to the directions of the examples in the accompanying drawings. Nothing in this specification should be understood as requiring a specific three-dimensional direction of the structure to fall within the scope of the present disclosure.

FIG. 1 to FIG. 3, FIG. 5 to FIG. 8, FIG. 10 to FIG. 13, and FIG. 15 to FIG. 17 are respectively schematic structural diagrams of semiconductor structures in steps of a method of forming a capacitor hole according to the present disclosure. In the exemplary implementation, the method of forming a capacitor hole provided in the present disclosure is described by using an example of a manufacturing process in which a capacitor tube of a semiconductor structure is formed through an immersion lithography process. It is easily understandable for those skilled in the art that, in order to apply the relevant design of the present disclosure to other types of capacitor structures or other processes, various modifications, additions, substitutions, deletions, or other changes may be made to the following specific implementations, but such changes are still within the scope of the principle of the method of forming a capacitor hole provided in the present disclosure.

As shown in FIG. 1 to FIG. 3, FIG. 5 to FIG. 8, FIG. 10 to FIG. 13, and FIG. 15 to FIG. 17, in this implementation, the method of forming a capacitor hole provided by the present disclosure includes:

providing a substrate 100, where an electrode 101 is formed in the substrate 100;

forming a pattern definition layer 200 on a surface of the substrate 100;

sequentially forming three sets of trenches G1, G2, G3 in the pattern definition layer 200, where the three sets of trenches G1, G2, G3 intersect with each other at 120°, and a hexagonal hole h is formed at intersection position in the pattern definition layer 200; and etching the substrate 100 along the hexagonal hole h by using the pattern definition layer 200 as a mask, to form a capacitor hole H in the substrate 100, where a bottom of the capacitor hole H is round under a loading effect of etching, and the electrode 101 is exposed at the bottom of the capacitor hole H.

In the method of forming a capacitor hole provided by the present disclosure, a hexagonal hole h is formed by using a triple exposure process, and in the process of forming a capacitor hole H by transferring the hole h downward, under the etching load effect, straight edges of the hexagonal profile at the top of the capacitor hole H become arc-shaped edges, to form a more regular round shape, thereby significantly improving the shape of the bottom of the capacitor hole H. Through the above design, the present disclosure can ensure a round bottom of the capacitor hole H, such that the curvature of the capacitor hole is kept uniform.

As shown in FIG. 1 to FIG. 3, FIG. 5 to FIG. 8, FIG. 10 to FIG. 13, and FIG. 15 to FIG. 17, in this implementation, the step of "forming a pattern definition layer 200 on a surface of the substrate 100" may specifically include:

forming a first passivation layer 210 on the surface of the substrate 100; and forming a first anti-reflection layer 220 on a surface of the first passivation layer 210, where the first anti-reflection layer 220 and the first passivation layer 210 jointly constitute the pattern definition layer 200, and the three sets of trenches G1, G2, G3 are formed in the first anti-reflection layer 220.

As shown in FIG. 3, FIG. 8, FIG. 13 and FIG. 15, based on the above process design of forming the pattern definition layer 200, in this implementation, the step of "forming a hexagonal hole h" is forming the hexagonal hole h in the first passivation layer 210 at the intersection position of the three sets of trenches G1, G2, G3 after the three sets of trenches G1, G2, G3 are formed in the first anti-reflection layer 220, where the hexagonal hole h is the pattern of the pattern definition layer 200.

Figure 2:
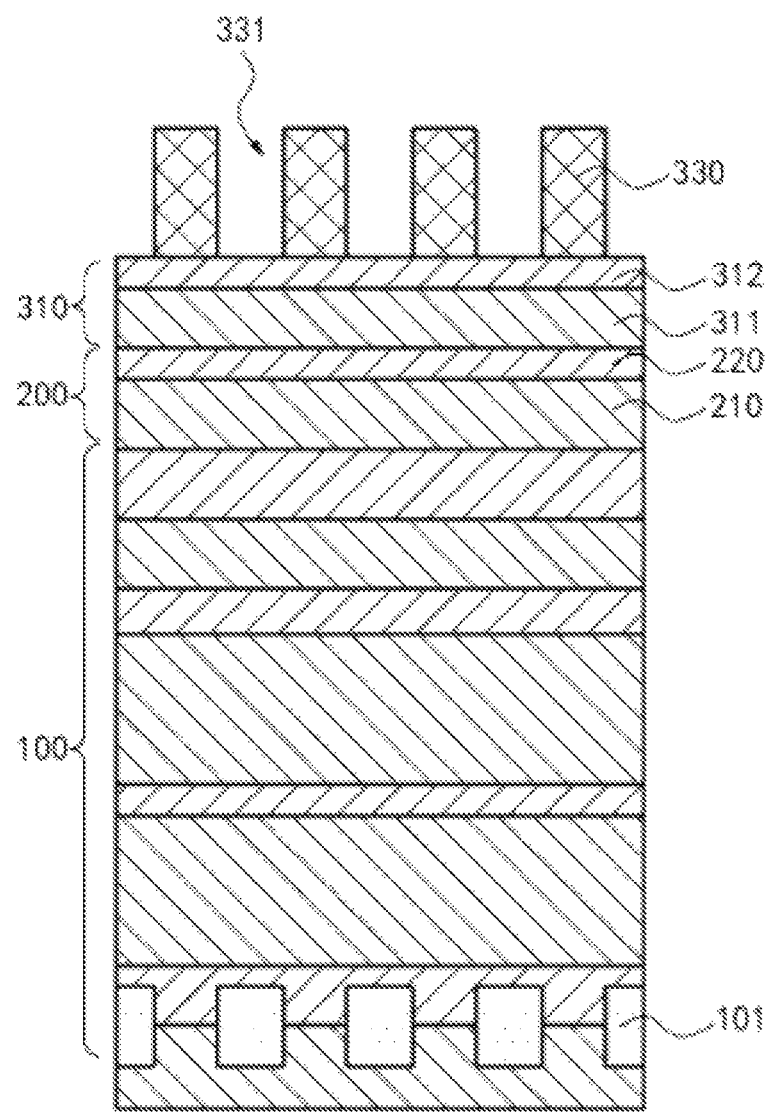
Figure 3:
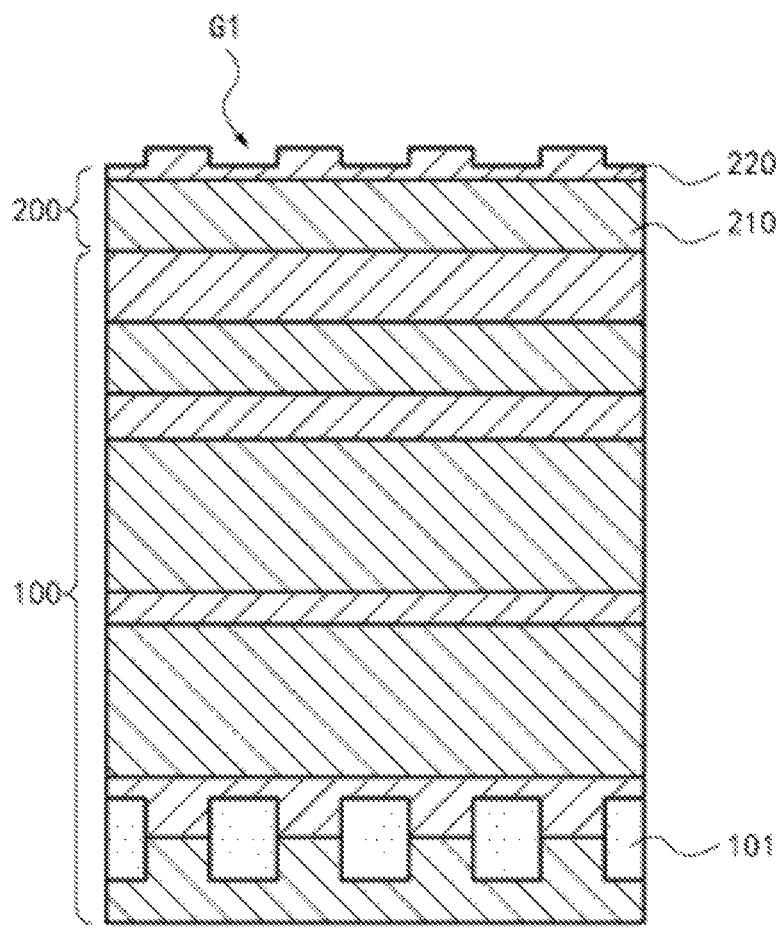

As shown in FIG. 1 to FIG. 3, the step of "forming a first set of trenches G1 in the pattern definition layer 200" may specifically include:

forming a first mask layer 310 on a surface of the pattern definition layer 200;

forming a first trench structure 331 on a surface of the first mask layer 310 through a pitch doubling process; and etching the pattern definition layer 200 by using the first mask layer 310 as a mask, and transferring the first trench structure 331 to the pattern definition layer 200 to form the first set of trenches G1.

As shown in FIG. 1 to FIG. 3, based on the above process design of forming the first set of trenches G1, in this implementation, the step of "forming a first mask layer 310 on a surface of the pattern definition layer 200" may specifically include:

forming a second passivation layer 311 on the surface of the pattern definition layer 200; and forming a second anti-reflection layer 312 on a surface of the second passivation layer 311, where the second anti-reflection layer 312 and the second passivation layer 311 jointly constitute the first mask layer 310.

As shown in FIG. 1 to FIG. 3, based on the above process design of forming the first set of trenches G1, in this implementation, the step of "forming a first trench structure 331 on a surface of the first mask layer 310 through a pitch doubling process" may specifically include:

forming a first photoresist layer 320 on the surface of the first mask layer 310;

patterning the first photoresist layer 320 to form a first opening 321;

forming a first sacrificial layer 330 on the surface of the first mask layer 310 and a surface of the first photoresist layer 320, where the first sacrificial layer 330 covers a side wall and a bottom wall of the first opening 321; and etching to remove part of the first sacrificial layer 330 on the surface of the first mask layer 310 and the first sacrificial layer 330 on the top of the first photoresist layer 320, where the remaining first sacrificial layer 330 is the first trench structure 331.

FIG. 1 representatively shows a schematic structural diagram of a semiconductor structure in the step of "forming a first sacrificial layer 330 on the surface of the first mask layer 310 and a surface of the first photoresist layer 320". In this step, the semiconductor structure includes the substrate 100, the pattern definition layer 200, the first mask layer 310, the patterned first photoresist layer 320, and the first sacrificial layer 330. An electrode 101 is formed in the substrate 100. The pattern definition layer 200 is formed on the surface of the substrate 100, and includes a first passivation layer 210 and a first anti-reflection layer 220. The first mask layer 310 is formed on the surface of the pattern definition layer 200 and includes a second passivation layer 311 and a second anti-reflection layer 312. The first photoresist layer 320 is formed on the surface of the first mask layer 310, and the first photoresist layer 320 is patterned to form the first opening 321. The first sacrificial layer 330 is formed on the surface of the first mask layer 310 and the surface of the remaining first photoresist layer 320. That is, the first sacrificial layer 330 covers the surface of the first mask layer 310 exposed by the first opening 321, and also covers the side wall and the bottom wall of the first opening 321.

As shown in FIG. 1, the substrate 100 in this implementation specifically includes a silicon base and a laminated structure. On this basis, the electrode 101 is formed in the silicon base and exposed to the surface of the silicon base. The laminated structure is formed on the surface of the silicon base and covers the electrode 101. Moreover, in the subsequent step of forming a capacitor hole H, the capacitor hole H is specifically formed after removal of the laminated structure It is to be noted that, for ease of understanding and illustration, the above silicon base and laminated structure in the specification are collectively referred to as "substrate 100".

In this implementation, a material of the electrode 101 may be, but is not limited to, tungsten (W).

In this implementation, the first passivation layer 210 may be, but is not limited to, a diamond-like carbon (DLC) coating.

In this implementation, a material of the first anti-reflection layer 220 may be, but is not limited to, silicon oxynitride (SiON).

In this implementation, a material of the second passivation layer 311 may be, but is not limited to, a DLC coating.

In this implementation, a material of the first sacrificial layer 330 may be, but is not limited to, silicon dioxide ($SiO_2$).

In this implementation, a material of the second anti-reflection layer 312 may be, but is not limited to, silicon oxynitride.

FIG. 2 representatively shows a schematic structural diagram of a semiconductor structure in the step of "forming a first trench structure 331 on a surface of the first mask layer 310". In this step, the semiconductor structure includes the substrate 100, the pattern definition layer 200, the first mask layer 310, and the remaining first sacrificial layer 330. Through the pitch doubling process, part of the first sacrificial layer 330 located on the surface of the first mask layer 310 and the first sacrificial layer 330 on the top of the first photoresist layer 320 is removed by etching, and the remaining first sacrificial layer 330 forms the first trench structure 331. Moreover, in the above etching process, the remaining first photoresist layer 320 is removed completely.

Figure 4:
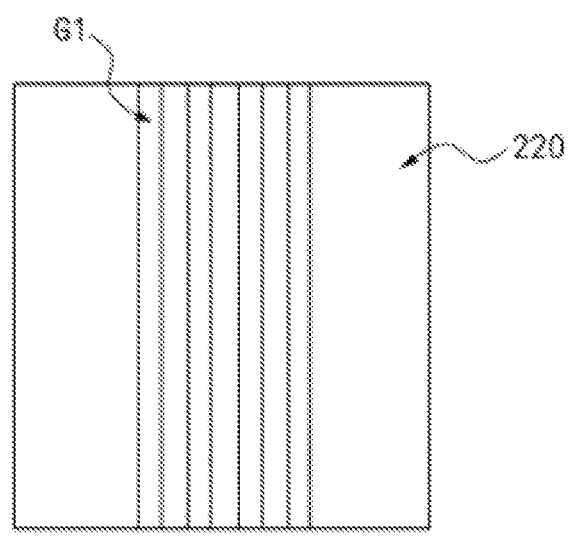

FIG. 3 representatively shows a schematic structural diagram of a semiconductor structure in the step of "transferring the first trench structure 331 to the pattern definition layer 200 to form the first set of trenches G1". FIG. 4 representatively shows a plan view of a semiconductor structure in the step of "transferring the first trench structure 331 to the pattern definition layer 200 to form the first set of trenches G1". In this step, the semiconductor structure includes the substrate 100 and the pattern definition layer 200 in which the first set of trenches G1 are formed. In this step, the first trench structure 331 may be transferred to the first anti-reflection layer 220 of the pattern definition layer 200 through a dry etching process, thereby forming the first set of trenches G1 on the surface of the first anti-reflection layer 220. Moreover, in the above etching process, the first trench structure 331 (that is, the remaining first sacrificial layer 330) and the first mask layer 310 are removed completely.

As shown in FIG. 5 to FIG. 8, the step of "forming a second set of trenches G2 in the pattern definition layer 200" may specifically include:
  forming a second mask layer 410 on a surface of the pattern definition layer 200, where the second mask layer 410 fills the first set of trenches G1;
  forming a second trench structure 431 on a surface of the second mask layer 410 through a pitch doubling process; and
  etching the pattern definition layer 200 by using the second mask layer 410 as a mask, and transferring the second trench structure 431 to the pattern definition layer 200 to form the second set of trenches G2.

As shown in FIG. 5 to FIG. 8, based on the above process design of forming the second set of trenches G2, in this implementation, the step of "forming a second mask layer 410 on a surface of the pattern definition layer 200" may specifically include:
  forming a third passivation layer 411 on the surface of the pattern definition layer 200; and
  forming a third anti-reflection layer 412 on a surface of the third passivation layer 411, where the third anti-reflection layer 412 and the third passivation layer 411 jointly constitute the second mask layer 410.

As shown in FIG. 5 to FIG. 8, based on the above process design of forming the second set of trenches G2, in this implementation, the step of "forming a second trench structure 431 on a surface of the second mask layer 410 through a pitch doubling process" may specifically include:
  forming a second photoresist layer 420 on the surface of the second mask layer 410;
  patterning the second photoresist layer 420 to form a second opening 421;
  forming a second sacrificial layer 430 on the surface of the second mask layer 410 and a surface of the second photoresist layer 420, where the second sacrificial layer 430 covers a side wall and a bottom wall of the second opening 421; and
  etching to remove part of the second sacrificial layer 430 on the surface of the second mask layer 410 and the second sacrificial layer 430 on the top of the second photoresist layer 420, where the remaining second sacrificial layer 430 is the second trench structure 431.

Figure 5:
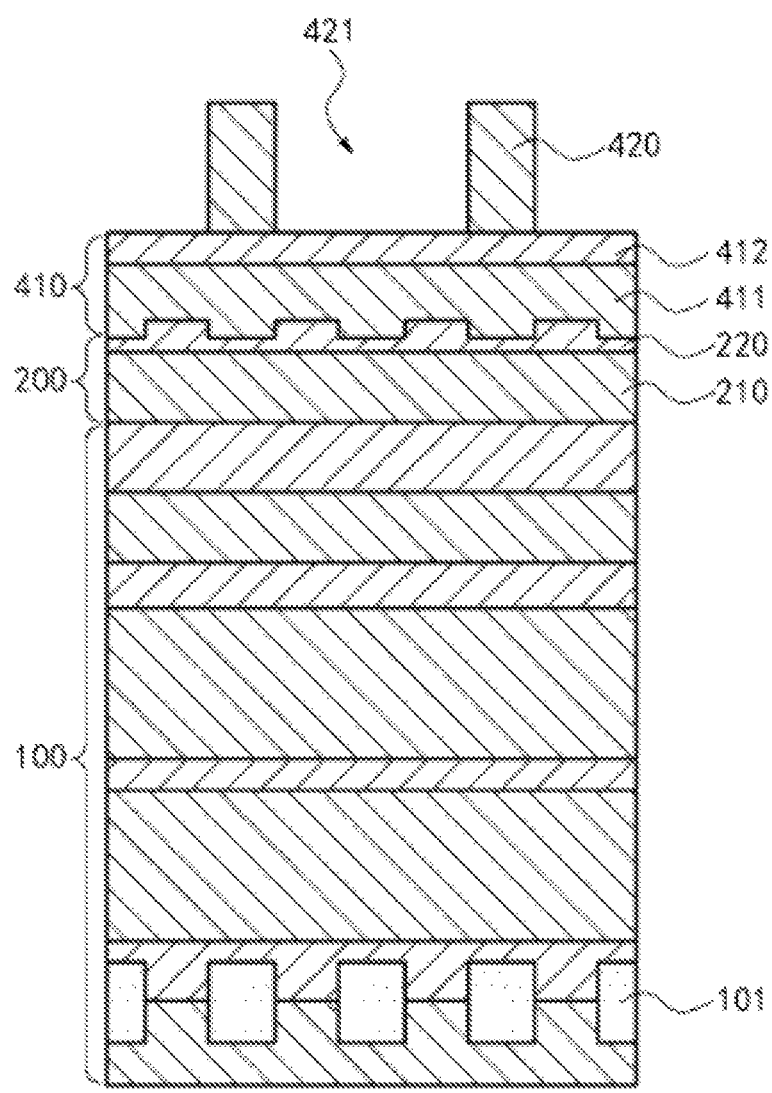

FIG. 5 representatively shows a schematic structural diagram of a semiconductor structure in the step of "forming a second photoresist layer 420 on the second mask layer 410". In this step, the semiconductor structure includes the substrate 100, the pattern definition layer 200 in which the first set of trenches G1 are formed, the second mask layer 410, and the patterned second photoresist layer 420. The second mask layer 410 is formed on the surface of the pattern definition layer 200, and the second mask layer 410 fills the first set of trenches G1 on the surface of the first anti-reflection layer 220. The second mask layer 410 includes a third passivation layer 411 and a third anti-reflection layer 412. The second photoresist layer 420 is formed on the surface of the second mask layer 410, and the second photoresist layer 420 is patterned to form the second opening 421.

In this implementation, the third passivation layer 411 may be formed on the pattern definition layer 200 through a spin coating process.

In this implementation, a material of the third anti-reflection layer 412 may be, but is not limited to, silicon oxynitride.

Figure 6:
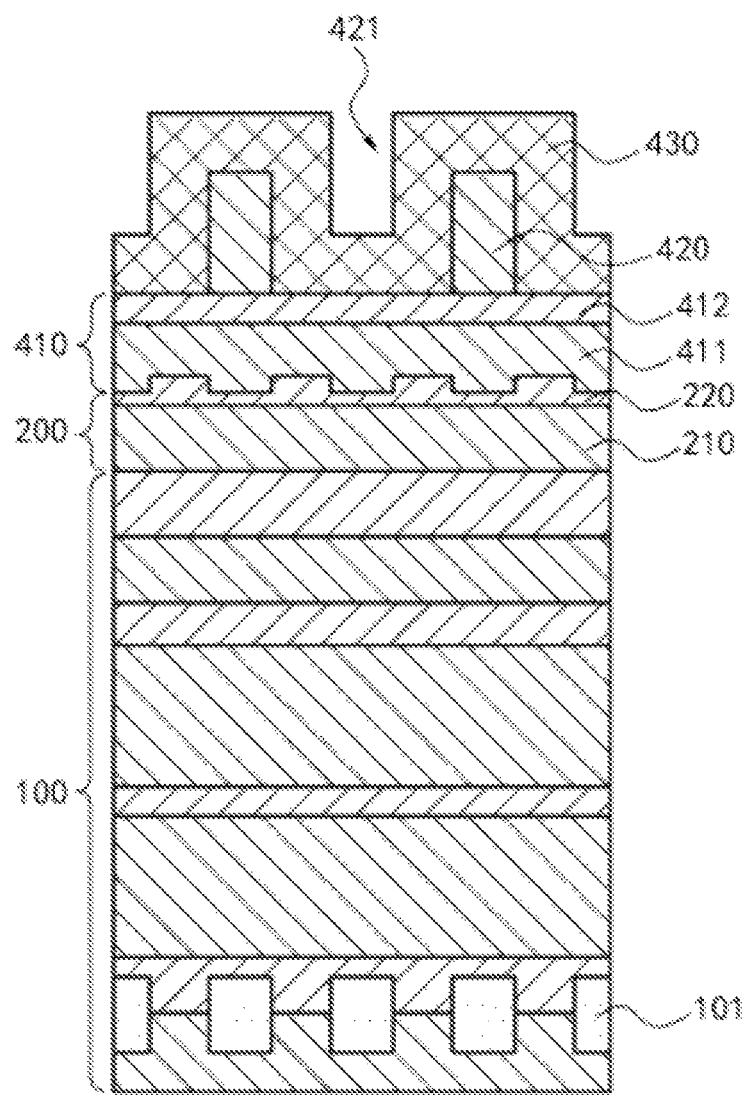

FIG. 6 representatively shows a schematic structural diagram of a semiconductor structure in the step of "forming a second sacrificial layer 430 on the surface of the second mask layer 410 and a surface of the second photoresist layer 420". In this step, the semiconductor structure includes the substrate 100, the pattern definition layer 200 in which the first set of trenches G1 are formed, the second mask layer 410, the patterned second photoresist layer 420, and the second sacrificial layer 430. The second sacrificial layer 430 is formed on the surface of the second mask layer 410 and the surface of the remaining second photoresist layer 420. That is, the second sacrificial layer 430 covers the surface of the second mask layer 410 exposed by the second opening 421, and also covers the side wall and the bottom wall of the second opening 421.

In this implementation, a material of the second sacrificial layer 430 may be, but is not limited to, silicon dioxide.

Figure 7:
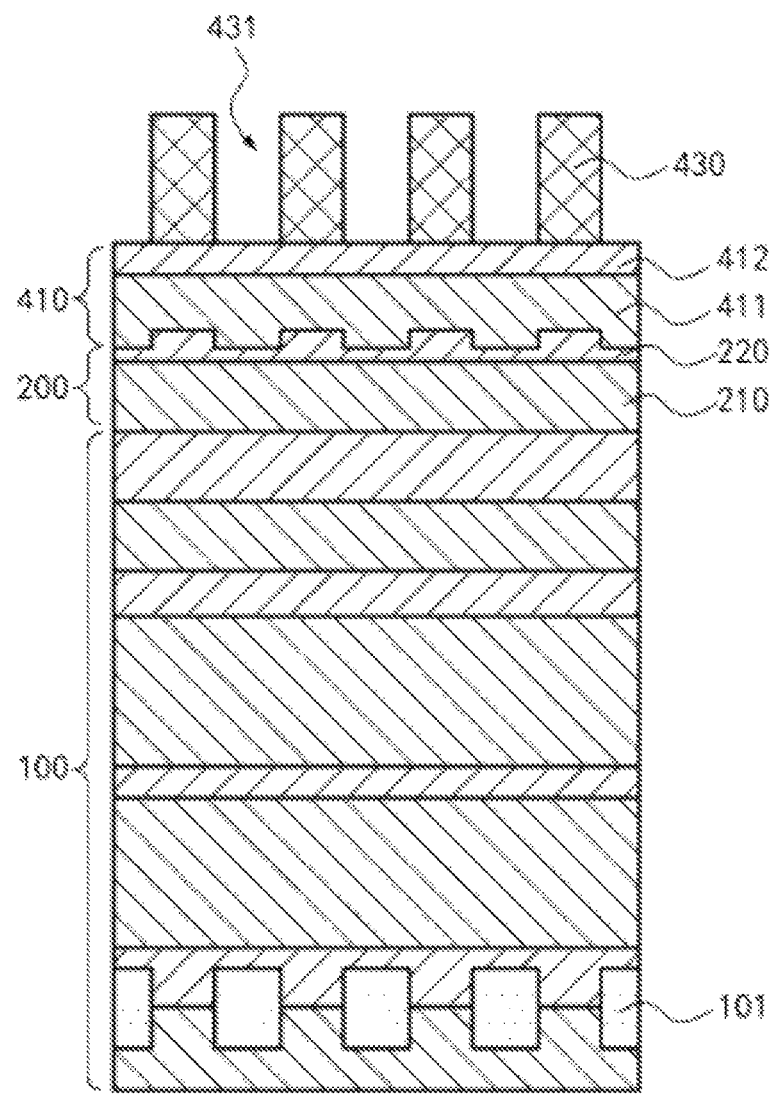

FIG. 7 representatively shows a schematic structural diagram of a semiconductor structure in the step of "forming a second trench structure 431 on a surface of the second mask layer 410". In this step, the semiconductor structure includes the substrate 100, the pattern definition layer 200 in which the first set of trenches G1 are formed, the second mask layer 410, and the remaining second sacrificial layer 430. Through the pitch doubling process, part of the second sacrificial layer 430 located on the surface of the second mask layer 410 and the second sacrificial layer 430 on the top of the second photoresist layer 420 is removed by etching, and the remaining second sacrificial layer 430 forms the second trench structure 431. Moreover, in the above etching process, the remaining second photoresist layer 420 is removed completely.

Figure 8:
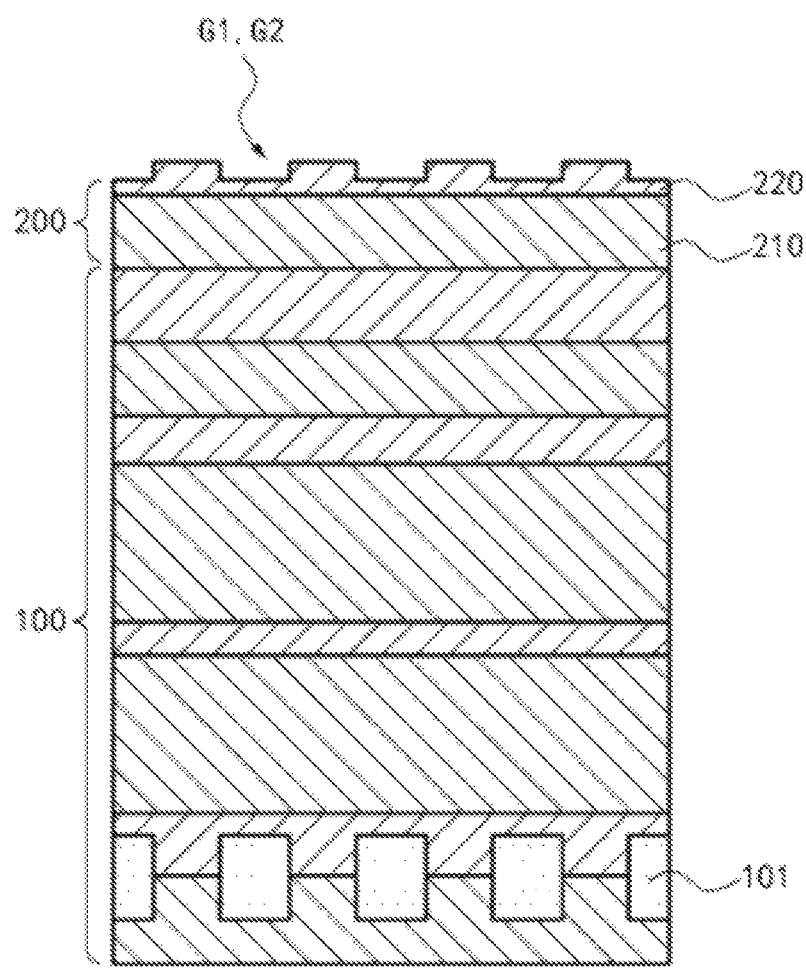
Figure 9:
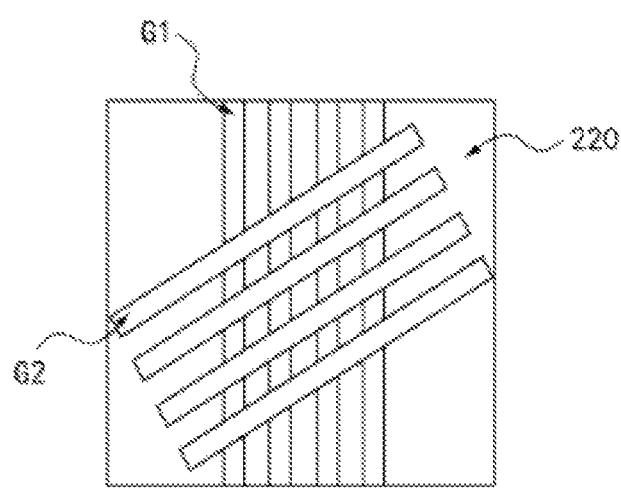

FIG. 8 representatively shows a schematic structural diagram of a semiconductor structure in the step of "transferring the second trench structure 431 to the pattern definition layer 200 to form the second set of trenches G2". FIG. 9 representatively shows a plan view of a semiconductor structure in the step of "transferring the second trench structure 431 to the pattern definition layer 200 to form the second set of trenches G2". In this step, the semiconductor structure includes the substrate 100 and the pattern definition layer 200 in which the first set of trenches G1 and the second set of trenches G2 are formed. In this step, the second trench structure 431 may be transferred to the first anti-reflection layer 220 of the pattern definition layer 200 through a dry etching process, thereby forming the second set of trenches G2 on the surface of the first anti-reflection layer 220 on which the first set of trenches G1 have been formed. Moreover, in the above etching process, the second trench structure 431 (that is, the remaining second sacrificial layer 430) and the second mask layer 410 are removed completely. In the plan view of the semiconductor structure shown in FIG. 9, an angle between the first set of trenches G1 and the second set of trenches G2 is 120°.

As shown in FIG. 10 to FIG. 13, the step of "forming a third set of trenches G3 in the pattern definition layer 200" may specifically include:
  forming a third mask layer 510 on a surface of the pattern definition layer 200, where the third mask layer 510 fills the first set of trenches G1 and the second set of trenches G2;
  forming a third trench structure 531 on a surface of the third mask layer 510 through a pitch doubling process; and
  etching the pattern definition layer 200 by using the third mask layer 510 as a mask, and transferring the third trench structure 531 to the pattern definition layer 200 to form the third set of trenches G3.

As shown in FIG. 10 to FIG. 13, based on the above process design of forming the third set of trenches G3, in this implementation, the step of "forming a third mask layer 510 on a surface of the pattern definition layer 200" may specifically include:
  forming a fourth passivation layer 511 on the surface of the pattern definition layer 200; and
  forming a fourth anti-reflection layer 512 on a surface of the fourth passivation layer 511, where the fourth anti-reflection layer 512 and the fourth passivation layer 511 jointly constitute the third mask layer 510.

As shown in FIG. 10 to FIG. 13, based on the above process design of forming the third set of trenches G3, in this implementation, the step of "forming a third trench structure 531 on a surface of the third mask layer 510 through a pitch doubling process" may specifically include:
  forming a third photoresist layer 520 on the surface of the third mask layer 510;
  patterning the third photoresist layer 520 to form a third opening 521;
  forming a third sacrificial layer 530 on the surface of the third mask layer 510 and a surface of the third photoresist layer 520, where the third sacrificial layer 530 covers a side wall and a bottom wall of the third opening 521; and
  etching to remove part of the third sacrificial layer 530 on the surface of the third mask layer 510 and the third sacrificial layer 530 on the top of the third photoresist layer 520, where the remaining third sacrificial layer 530 is the third trench structure 531.

Figure 10:
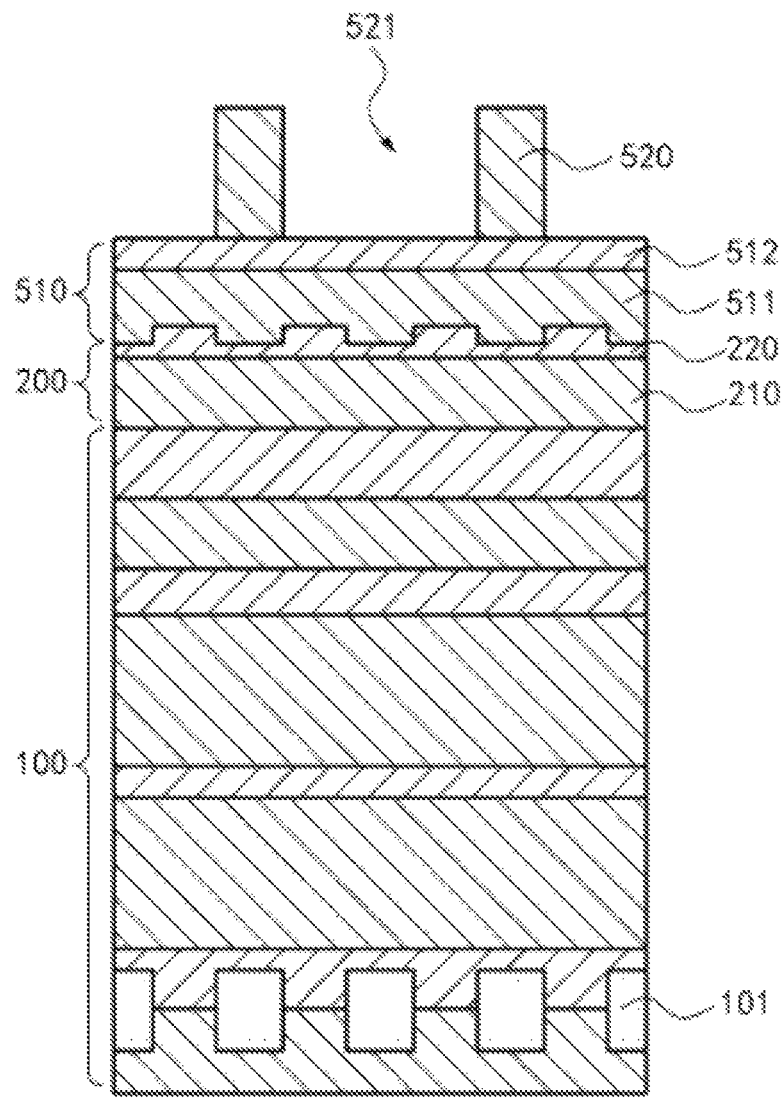

FIG. 10 representatively shows a schematic structural diagram of a semiconductor structure in the step of "forming a third photoresist layer 520 on the third mask layer 510". In this step, the semiconductor structure includes the substrate 100, the pattern definition layer 200 in which the first set of trenches G1 and the second set of trenches G2 are formed, the third mask layer 510, and the patterned third photoresist layer 520. The third mask layer 510 is formed on the surface of the pattern definition layer 200, and the third mask layer 510 fills the first set of trenches G1 and the second set of trenches G2 on the surface of the first anti-reflection layer 220. The third mask layer 510 includes a fourth passivation layer 511 and a fourth anti-reflection layer 512. The third photoresist layer 520 is formed on the surface of the third mask layer 510, and the third photoresist layer 520 is patterned to form the third opening 521.

In this implementation, the fourth passivation layer 511 may be formed on the pattern definition layer 200 through a spin coating process.

In this implementation, a material of the fourth anti-reflection layer 512 may be, but is not limited to, silicon oxynitride.

Figure 11:
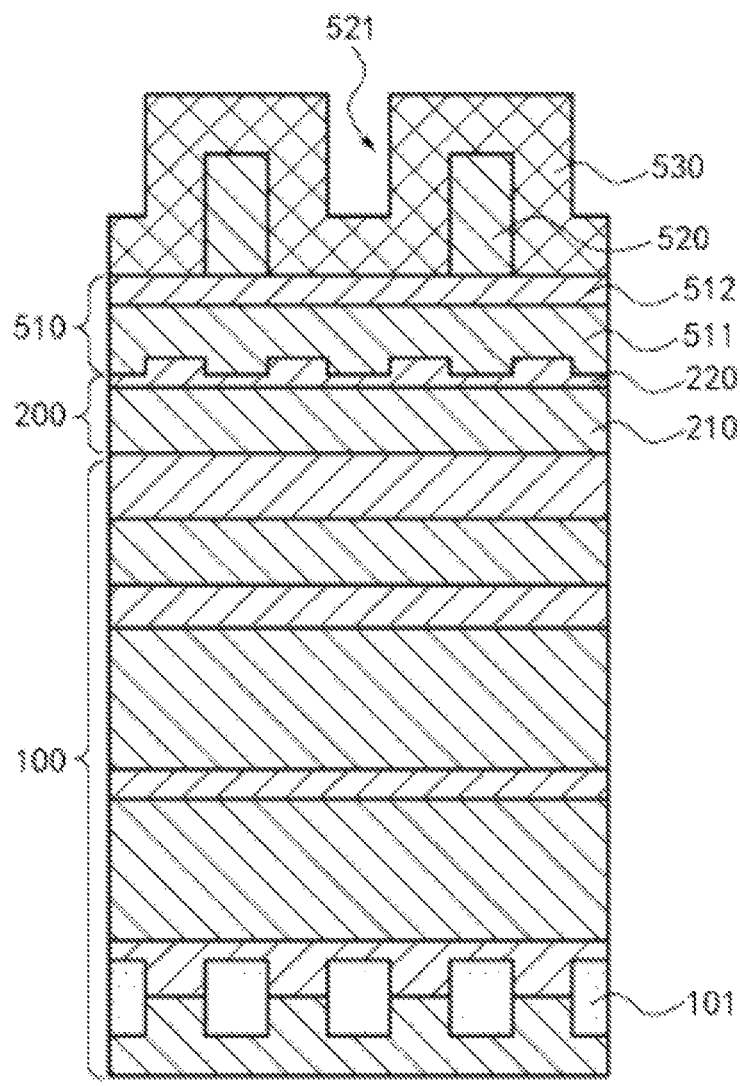

FIG. 11 representatively shows a schematic structural diagram of a semiconductor structure in the step of "forming a third sacrificial layer 530 on the surface of the third mask layer 510 and a surface of the third photoresist layer 520". In this step, the semiconductor structure includes the substrate 100, the pattern definition layer 200 in which the first set of trenches G1 and the second set of trenches G2 are formed, the third mask layer 510, the patterned third photoresist layer 520, and the third sacrificial layer 530. The third sacrificial layer 530 is formed on the surface of the third mask layer 510 and the surface of the remaining third photoresist layer 520. That is, the third sacrificial layer 530 covers the surface of the third mask layer 510 exposed by the third opening 521, and also covers the side wall and the bottom wall of the third opening 521.

In this implementation, a material of the third sacrificial layer 530 may be, but is not limited to, silicon dioxide.

Figure 12:
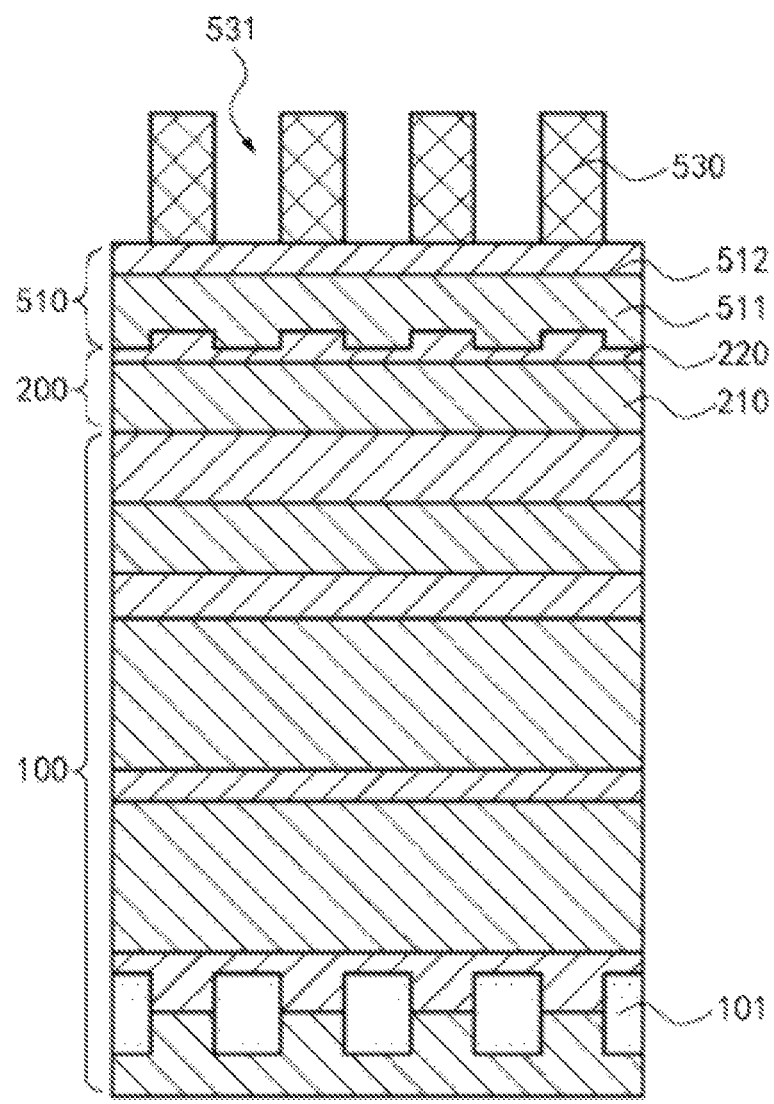

FIG. 12 representatively shows a schematic structural diagram of a semiconductor structure in the step of "forming a third trench structure 531 on a surface of the third mask layer 510". In this step, the semiconductor structure includes the substrate 100, the pattern definition layer 200 in which the first set of trenches G1 and the second set of trenches G2 are formed, the third mask layer 510, and the remaining third sacrificial layer 530. Through the pitch doubling process, part of the third sacrificial layer 530 located on the surface of the third mask layer 510 and the third sacrificial layer 530 on the top of the third photoresist layer 520 is removed by etching, and the remaining third sacrificial layer 530 forms the third trench structure 531. Moreover, in the above etching process, the remaining third photoresist layer 520 is removed completely.

Figure 13:
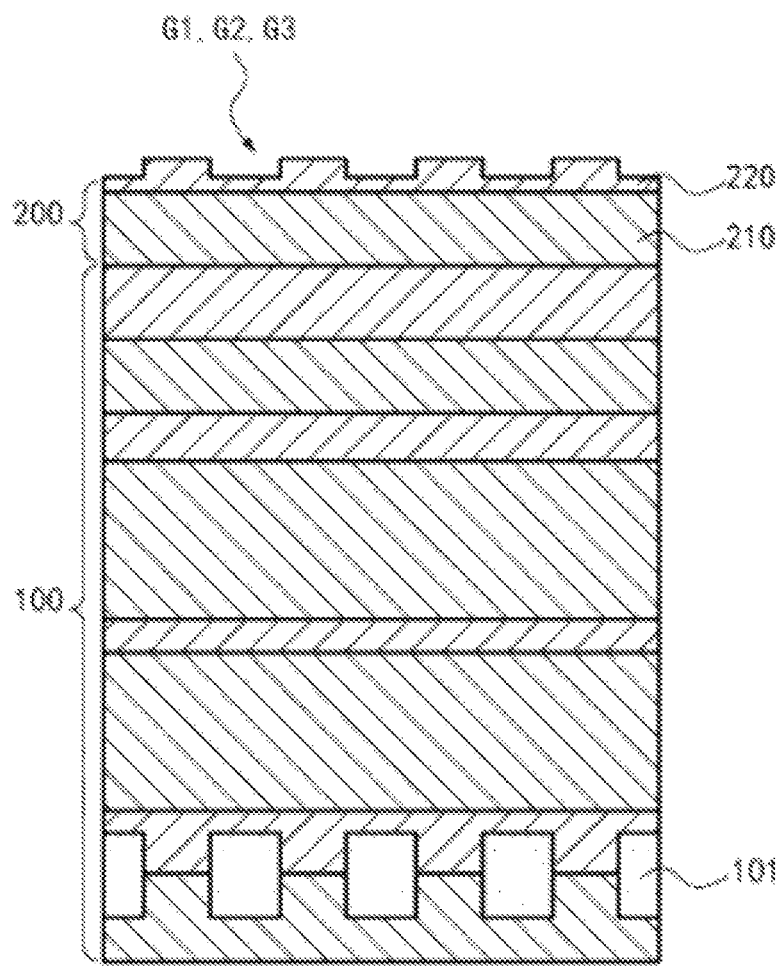
Figure 14:
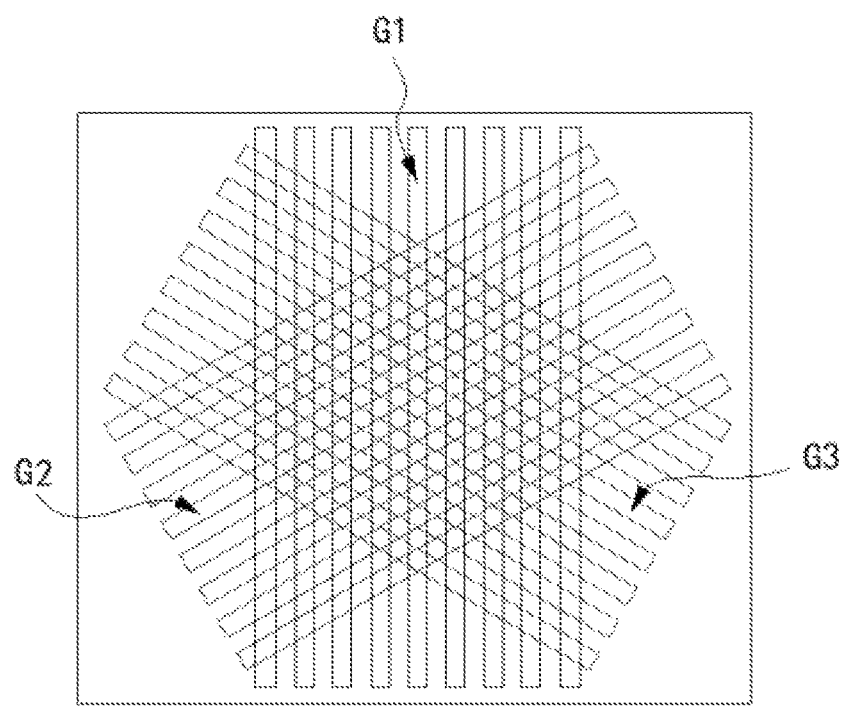

FIG. 13 representatively shows a schematic structural diagram of a semiconductor structure in the step of "transferring the third trench structure 531 to the pattern definition layer 200 to form the third set of trenches G3". FIG. 14 representatively shows a plan view of a semiconductor structure in the step of "transferring the third trench structure 531 to the pattern definition layer 200 to form the third set of trenches G3". In this step, the semiconductor structure includes the substrate 100 and the pattern definition layer 200 in which the first set of trenches G1, the second set of trenches G2, and the third set of trenches G3 are formed. In this step, the third trench structure 531 may be transferred to the first anti-reflection layer 220 of the pattern definition layer 200 through a dry etching process, thereby forming the third set of trenches G3 on the surface of the first anti-reflection layer 220 on which the first set of trenches G1 and the second set of trenches G2 have been formed. Moreover, in the above etching process, the third trench structure 531 (that is, the remaining third sacrificial layer 530) and the third mask layer 510 are removed completely. In the plan view of the semiconductor structure shown in FIG. 14, an angle between the first set of trenches G1 and the third set of trenches G3 is 120°, and an angle between the second set of trenches G2 and the third set of trenches G3 is 120°. That is, the three sets of trenches G1, G2, G3 intersect with each other at 120°.

Figure 15:
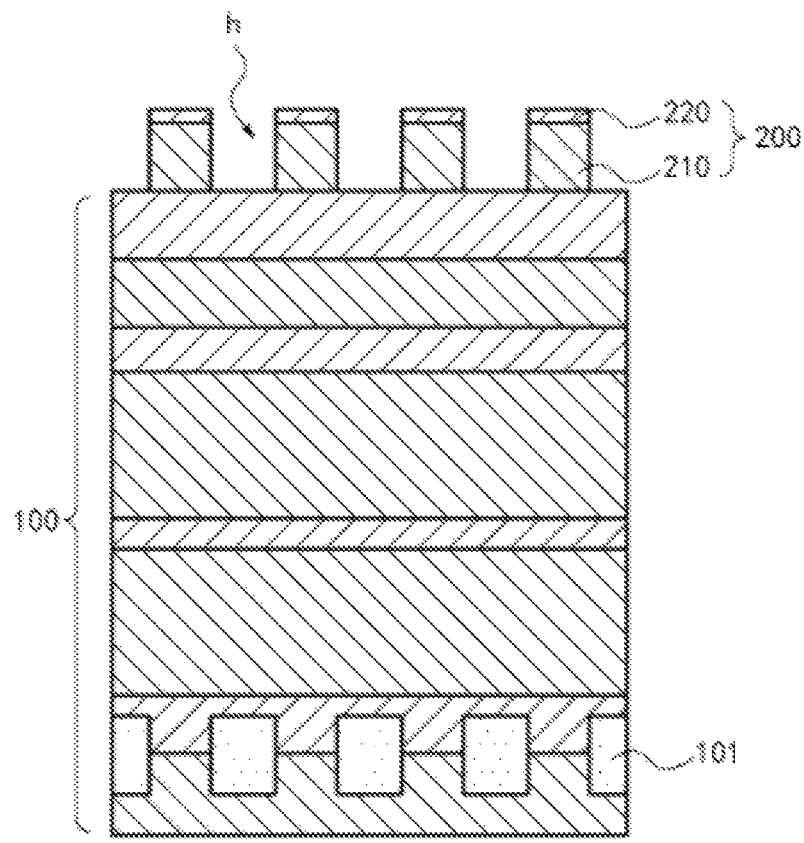
Figure 16:
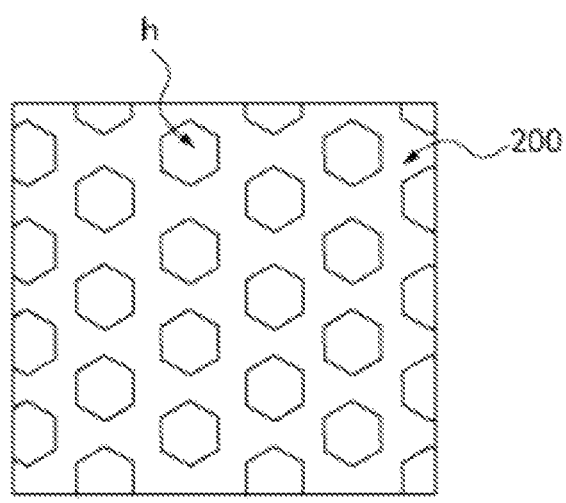

FIG. 15 representatively shows a schematic structural diagram of a semiconductor structure in the step of "forming a hexagonal hole h in the pattern definition layer 200". FIG. 16 representatively shows a plan view of the semiconductor structure in this step. In this step, after the three sets of trenches G1, G2, G3 are formed in the first anti-reflection layer 220, the hexagonal hole h is formed in the first passivation layer 210 at the intersection position of the three sets of trenches G1, G2, G3 in the first anti-reflection layer 220. Because the three sets of trenches G1, G2, G3 intersect with each other at 120°, a hexagonal hole h is formed in the pattern definition layer 200 at the intersection position of the three sets of trenches G1, G2, G3.

Figure 17:
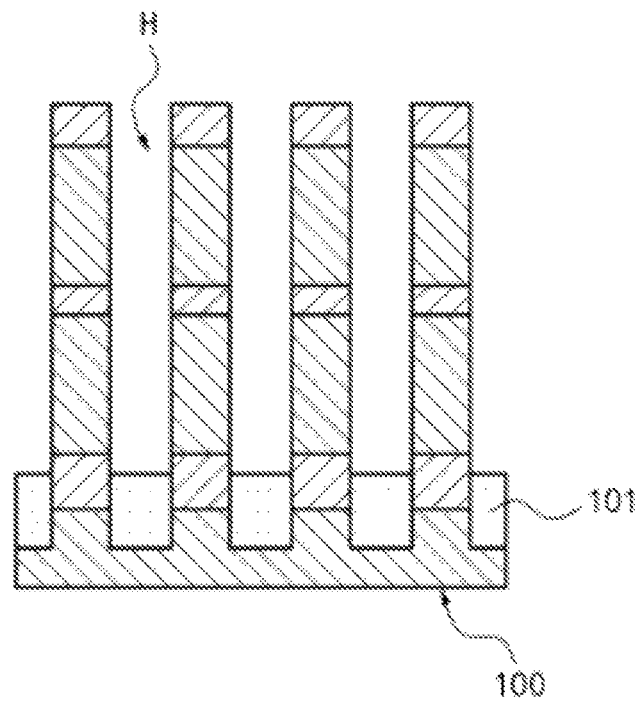
Figure 18:
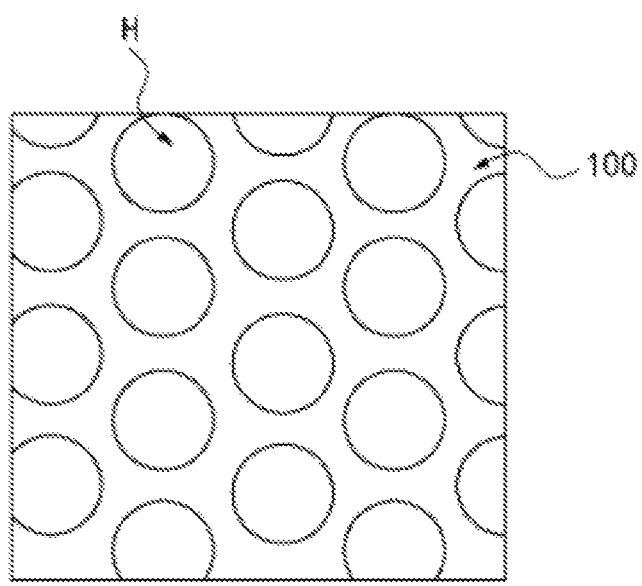

FIG. 17 representatively shows a schematic structural diagram of a semiconductor structure in the step of "forming a capacitor hole H". FIG. 18 representatively shows a plan view of the semiconductor structure in this step. In this step, as the hexagonal hole h of the pattern definition layer 200 is transferred downward, straight edges of the hexagonal profile at the top of the capacitor hole H become arc-shaped edges under the etching load effect, to form a more regular round shape. The electrode 101 in the substrate 100 is exposed at the bottom of the capacitor hole H.

It should be noted here that the method of forming a capacitor hole shown in the drawings and described in this specification only show a few examples of the many forming methods that may adopt the principles of the present disclosure. It should be clearly understood that the principle of the present disclosure is by no means limited to any details or any steps of the method of forming a capacitor hole shown in the drawings or described in this specification.

Based on the foregoing detailed description of the exemplary implementations of the method of forming a capacitor hole provided in the present disclosure, an exemplary implementation of the semiconductor structure provided in the present disclosure is described below.

In this implementation, the semiconductor structure provided in the present disclosure includes a capacitor hole, and the capacitor hole of the semiconductor structure is formed by using the method of forming a capacitor hole described in detail in the foregoing implementations and provided in the present disclosure.

It should be noted here that the semiconductor structure shown in the drawings and described in the specification only show a few examples of the many semiconductor structures that may adopt the principles of the present disclosure. It should be clearly understood that the principle of the present disclosure is by no means limited to any details or any components of the semiconductor structure shown in the drawings or described in the specification.

In conclusion, in the method of forming a capacitor hole provided by the present disclosure, a hexagonal hole is formed by using a triple exposure process, and in the process of forming a capacitor hole by transferring the hole downward, under the etching load effect, straight edges of the hexagonal profile at the top of the capacitor hole become arc-shaped edges, to form a more regular round shape, thereby significantly improving the shape of the bottom of the capacitor hole. Through the above design, the present disclosure can ensure a round bottom of the capacitor hole, such that the curvature of the capacitor hole is kept uniform.

Exemplary implementations of the method of forming a capacitor hole, and a semiconductor structure provided by the present disclosure are described in detail/illustrated above. In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

The terms such as "first" and "second" used in the present disclosure may be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method of forming a capacitor hole provided by the present disclosure, a hexagonal hole is formed by using a triple exposure process, and in the process of forming a capacitor hole by transferring the hole downward, under the etching load effect, straight edges of the hexagonal profile at the top of the capacitor hole become arc-shaped edges, to form a more regular round shape, thereby significantly improving the shape of the bottom of the capacitor hole. Through the above design, the present disclosure can ensure a round bottom of the capacitor hole, such that the curvature of the capacitor hole is kept uniform.

The invention claimed is:

1. A method of forming a capacitor hole, comprising:
    providing a substrate, wherein an electrode is formed in the substrate;
    forming a pattern definition layer on a surface of the substrate;
    sequentially forming three sets of trenches in the pattern definition layer, wherein the three sets of trenches intersect with each other at 120°, and a hexagonal hole is formed at an intersection position in the pattern definition layer; and
    etching the substrate along the hexagonal hole by the pattern definition layer as a mask, to form a capacitor hole in the substrate, wherein a bottom of the capacitor hole is round under a loading effect of etching, and the electrode is exposed at the bottom of the capacitor hole.

2. The method of forming a capacitor hole according to claim 1, wherein the forming a pattern definition layer on a surface of the substrate comprises:
    forming a first passivation layer on the surface of the substrate; and
    forming a first anti-reflection layer on a surface of the first passivation layer, wherein the first anti-reflection layer and the first passivation layer jointly constitute the pattern definition layer, and the three sets of trenches are formed in the first anti-reflection layer.

3. The method of forming a capacitor hole according to claim 2, wherein, after the three sets of trenches are formed in the first anti-reflection layer, the hexagonal hole is formed in the first passivation layer at the intersection position of the three sets of trenches.

4. The method of forming a capacitor hole according to claim 1, wherein forming a first set of trenches in the pattern definition layer comprises:
    forming a first mask layer on a surface of the pattern definition layer;
    forming a first trench structure on a surface of the first mask layer through a pitch doubling process; and
    etching the pattern definition layer by the first mask layer as a mask, and transferring the first trench structure to the pattern definition layer to form the first set of trenches.

5. The method of forming a capacitor hole according to claim 4, wherein the forming a first trench structure on a surface of the first mask layer through a pitch doubling process comprises:
    forming a first photoresist layer on the surface of the first mask layer;
    patterning the first photoresist layer to form a first opening;
    forming a first sacrificial layer on the surface of the first mask layer and a surface of the first photoresist layer, wherein the first sacrificial layer covers a side wall and a bottom wall of the first opening; and
    etching to remove part of the first sacrificial layer on the surface of the first mask layer and the first sacrificial layer on a top of the first photoresist layer, wherein the remaining first sacrificial layer is the first trench structure.

6. The method of forming a capacitor hole according to claim 4, wherein the forming a first mask layer on a surface of the pattern definition layer comprises:
    forming a second passivation layer on the surface of the pattern definition layer; and
    forming a second anti-reflection layer on a surface of the second passivation layer, wherein the second anti-reflection layer and the second passivation layer jointly constitute the first mask layer.

7. The method of forming a capacitor hole according to claim 1, wherein forming a second set of trenches in the pattern definition layer comprises:
    forming a second mask layer on a surface of the pattern definition layer, wherein the second mask layer fills the first set of trenches;
    forming a second trench structure on a surface of the second mask layer through a pitch doubling process; and
    etching the pattern definition layer by the second mask layer as a mask, and transferring the second trench structure to the pattern definition layer to form the second set of trenches.

8. The method of forming a capacitor hole according to claim 7, wherein the forming a second trench structure on a surface of the second mask layer through a pitch doubling process comprises:
    forming a second photoresist layer on the surface of the second mask layer;
    patterning the second photoresist layer to form a second opening;
    forming a second sacrificial layer on the surface of the second mask layer and a surface of the second photoresist layer, wherein the second sacrificial layer covers a side wall and a bottom wall of the second opening; and etching to remove part of the second sacrificial layer on the surface of the second mask layer and the second sacrificial layer on a top of the second photoresist layer, wherein the remaining second sacrificial layer is the second trench structure.

9. The method of forming a capacitor hole according to claim 7, wherein the forming a second mask layer on a surface of the pattern definition layer comprises:

forming a third passivation layer on the surface of the pattern definition layer, wherein the third passivation layer fills the first set of trenches; and forming a third anti-reflection layer on a surface of the third passivation layer, wherein the third anti-reflection layer and the third passivation layer jointly constitute the second mask layer.

10. The method of forming a capacitor hole according to claim 9, wherein the third passivation layer is formed on the pattern definition layer through a spin coating process.

11. The method of forming a capacitor hole according to claim 1, wherein forming a third set of trenches in the pattern definition layer comprises:

forming a third mask layer on a surface of the pattern definition layer, wherein the third mask layer fills the first set of trenches and the second set of trenches;

forming a third trench structure on a surface of the third mask layer through a pitch doubling process; and etching the pattern definition layer by the third mask layer as a mask, and transferring the third trench structure to the pattern definition layer to form the third set of trenches.

12. The method of forming a capacitor hole according to claim 11, wherein the forming a third trench structure on a surface of the third mask layer through a pitch doubling process comprises:

forming a third photoresist layer on the surface of the third mask layer;

patterning the third photoresist layer to form a third opening;

forming a third sacrificial layer on the surface of the third mask layer and a surface of the third photoresist layer, wherein the third sacrificial layer covers a side wall and a bottom wall of the third opening; and etching to remove part of the third sacrificial layer on the surface of the third mask layer and the third sacrificial layer on a top of the third photoresist layer, wherein the remaining third sacrificial layer is the third trench structure.

13. The method of forming a capacitor hole according to claim 11, wherein the forming a third mask layer on a surface of the pattern definition layer comprises:

forming a fourth passivation layer on the surface of the pattern definition layer, wherein the fourth passivation layer fills the first set of trenches and the second set of trenches; and forming a fourth anti-reflection layer on a surface of the fourth passivation layer, wherein the fourth anti-reflection layer and the fourth passivation layer jointly constitute the third mask layer.

14. The method of forming a capacitor hole according to claim 13, wherein the fourth passivation layer is formed on the pattern definition layer through a spin coating process.

* * * * *